(12) United States Patent
Motoyama et al.

(10) Patent No.: US 12,027,384 B2
(45) Date of Patent: Jul. 2, 2024

(54) HEAT TREATMENT APPARATUS AND DUMMY SUBSTRATE PROCESSING METHOD

(71) Applicant: Tokyo Electron Limited, Tokyo (JP)

(72) Inventors: Yutaka Motoyama, Yamanashi (JP); Yoshihiro Takezawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/450,327

(22) Filed: Oct. 8, 2021

(65) Prior Publication Data

US 2022/0148893 A1 May 12, 2022

(30) Foreign Application Priority Data

Nov. 6, 2020 (JP) ................................ 2020-186101

(51) Int. Cl.
*H01L 21/67* (2006.01)
*H01L 21/02* (2006.01)
*H01L 21/677* (2006.01)

(52) U.S. Cl.
CPC .. *H01L 21/67098* (2013.01); *H01L 21/02554* (2013.01); *H01L 21/67757* (2013.01)

(58) Field of Classification Search
CPC ......... H01L 21/67098; H01L 21/02554; H01L 21/67757; H01L 21/02532; H01L 21/02592; H01L 21/02658; H01L 21/67103; H01L 21/67393; H01L 21/67766; H01L 21/67769; H01L 21/67389

See application file for complete search history.

(56) References Cited

U.S. PATENT DOCUMENTS

| | | | | |
|---|---|---|---|---|
| 5,551,984 A | * | 9/1996 | Tanahashi | ......... H01L 21/67757 118/724 |
| 2014/0242815 A1 | * | 8/2014 | Tanioka | ............ H01L 29/66068 438/795 |
| 2014/0305540 A1 | * | 10/2014 | Oyama | ............. H01L 21/67769 141/4 |

FOREIGN PATENT DOCUMENTS

| | | | | | |
|---|---|---|---|---|---|
| CN | 1669127 A | * | 9/2005 | ............. | C23C 16/46 |
| JP | 2003-006851 | | 1/2003 | | |
| JP | 2004023032 A | * | 1/2004 | ....... | H01L 21/67242 |
| JP | 2005032953 A | * | 2/2005 | ....... | H01L 21/67242 |
| JP | 3654684 B2 | * | 6/2005 | ....... | H01L 21/67242 |
| JP | 2006005214 A | * | 1/2006 | ....... | H01L 21/67242 |
| JP | 2010-147265 | | 7/2010 | | |
| JP | 2014-207306 | | 10/2014 | | |
| KR | 20080040902 A | * | 5/2009 | ....... | H01L 21/67242 |

* cited by examiner

*Primary Examiner* — Mohammed Shamsuzzaman
(74) *Attorney, Agent, or Firm* — IPUSA, PLLC

(57) ABSTRACT

A heat treatment apparatus for applying a heat treatment to a plurality of substrates including a product substrate and a dummy substrate includes: a process container configured to accommodate the plurality of substrates; a storage container provided outside the process container and configured to store the dummy substrate; and an oxidation mechanism configured to oxidize the dummy substrate stored in the storage container.

6 Claims, 12 Drawing Sheets

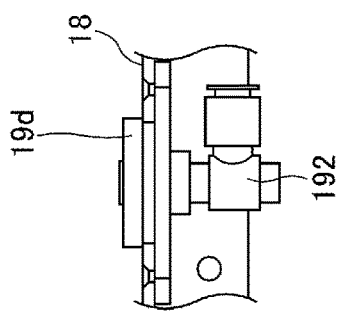
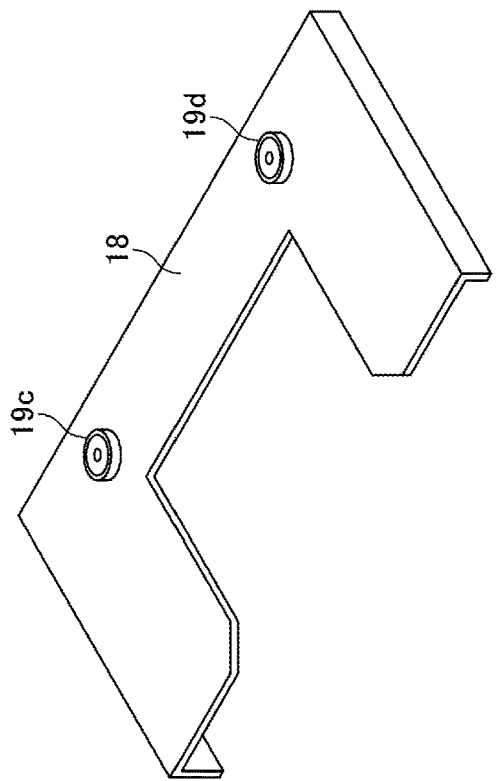
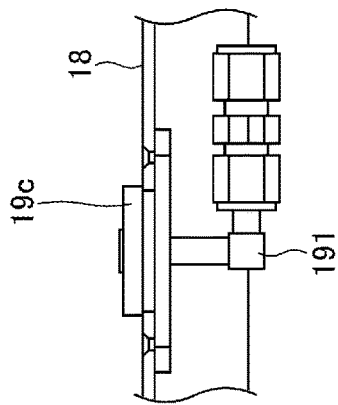
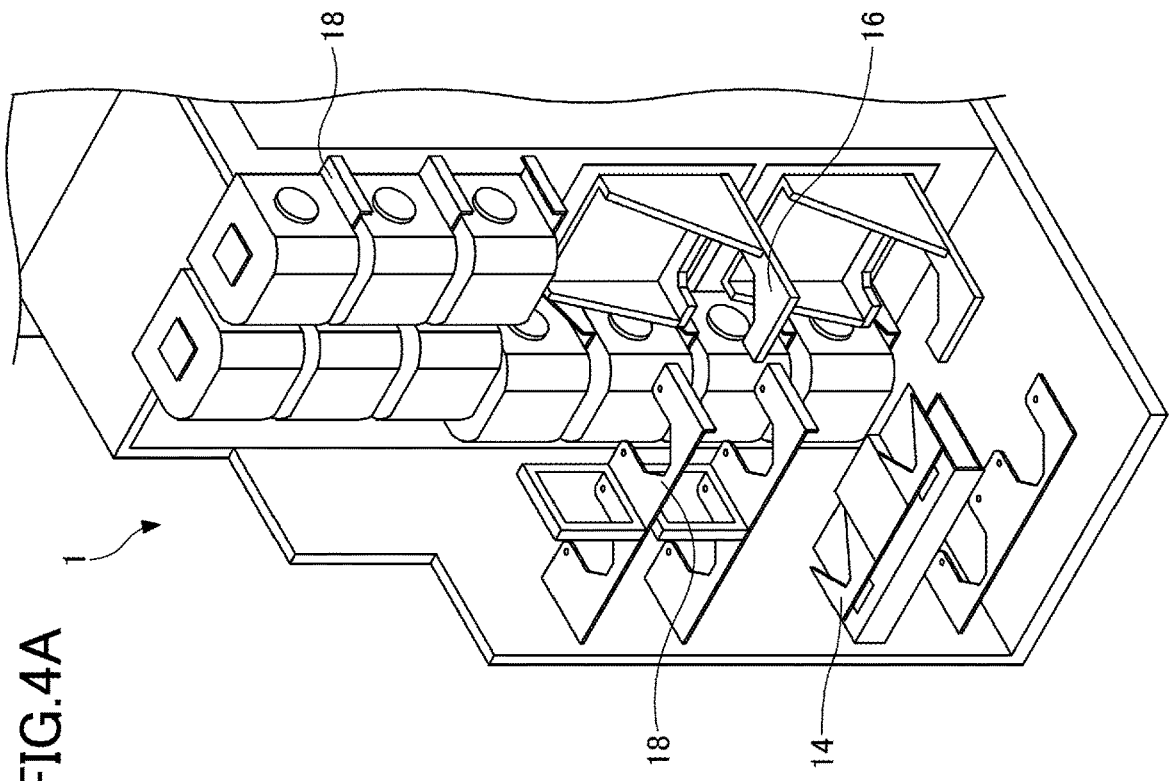

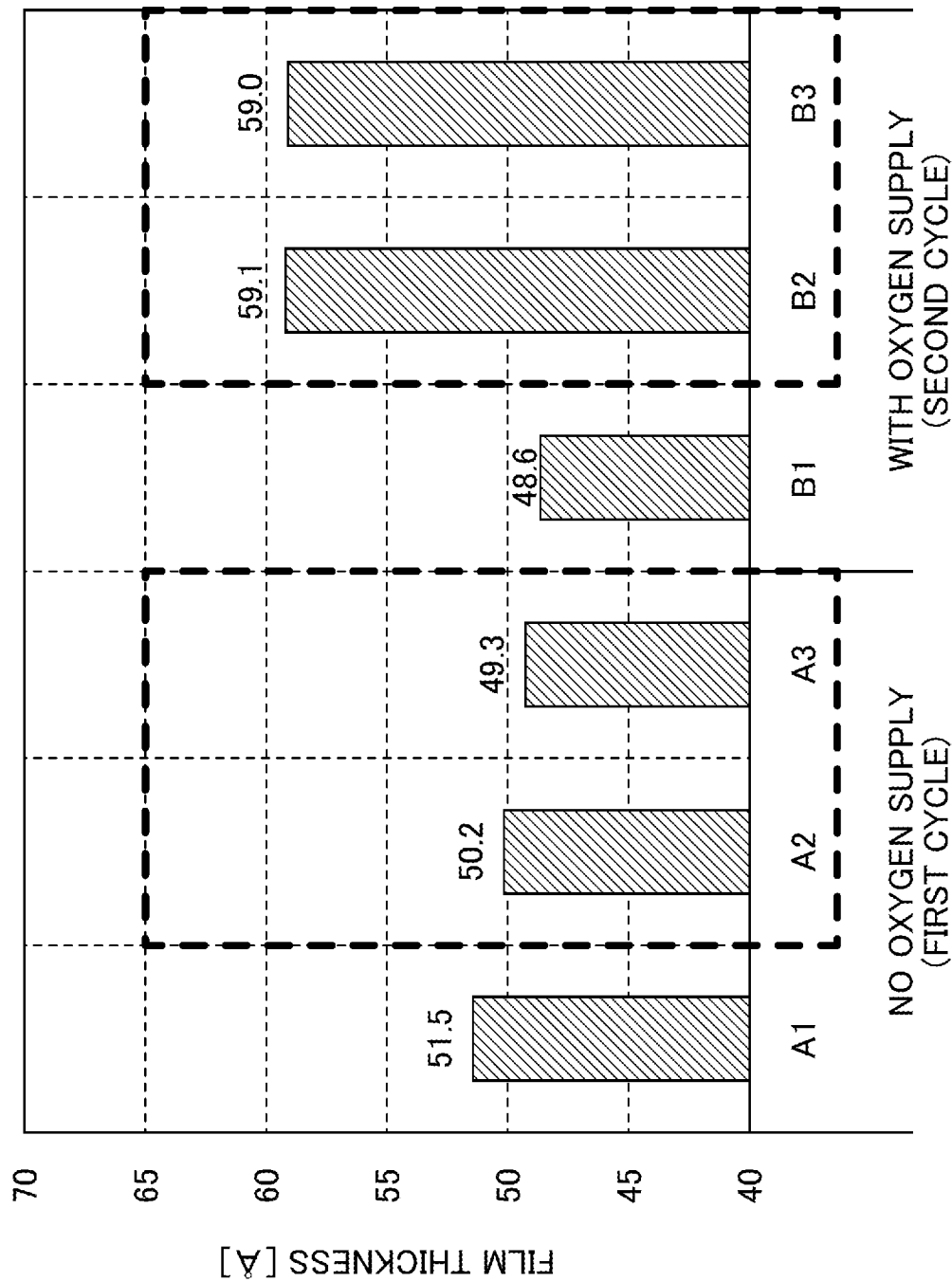

HEAT TREATMENT APPARATUS AND DUMMY SUBSTRATE PROCESSING METHOD

CROSS-REFERENCE TO RELATED APPLICATION

The present application is based upon and claims priority to Japanese Patent Application No. 2020-186101, filed on Nov. 6, 2020, the entire contents of which are incorporated herein by reference.

BACKGROUND

1. Field

The present disclosure relates to a heat treatment apparatus and a dummy substrate processing method.

2. Background Art

A batch type substrate processing apparatus is provided with a carrier storage rack that temporarily stores a plurality of carriers in order to process the wafers accommodated in the plurality of carriers at one time. An inert gas, for example, nitrogen ($N_2$) gas is supplied into a carrier placed in the carrier storage rack. As a result, nitrogen substitution is performed in the carrier, and a cleanliness of the carrier is maintained (see, e.g., Patent Document 1).

PRIOR ART DOCUMENT

Patent Document

[Patent Document 1] Japanese Laid-open Patent Publication No. 2014-207306

The present disclosure provides techniques that can improve process reproducibility.

SUMMARY

According to one aspect of the present disclosure, a heat treatment apparatus for applying a heat treatment to a plurality of substrates including a product substrate and a dummy substrate includes: a process container configured to accommodate the plurality of substrates; a storage container provided outside the process container and configured to store the dummy substrate; and an oxidation mechanism configured to oxidize the dummy substrate stored in the storage container.

According to the present disclosure, it is possible to improve process reproducibility.

BRIEF DESCRIPTION OF THE DRAWINGS

FIGS. 4A to 4D are diagrams illustrating an example of a carrier storage rack;

FIG. 10 is a diagram illustrating evaluation results of Example 1;

DESCRIPTION OF THE EMBODIMENTS

Figure 1:
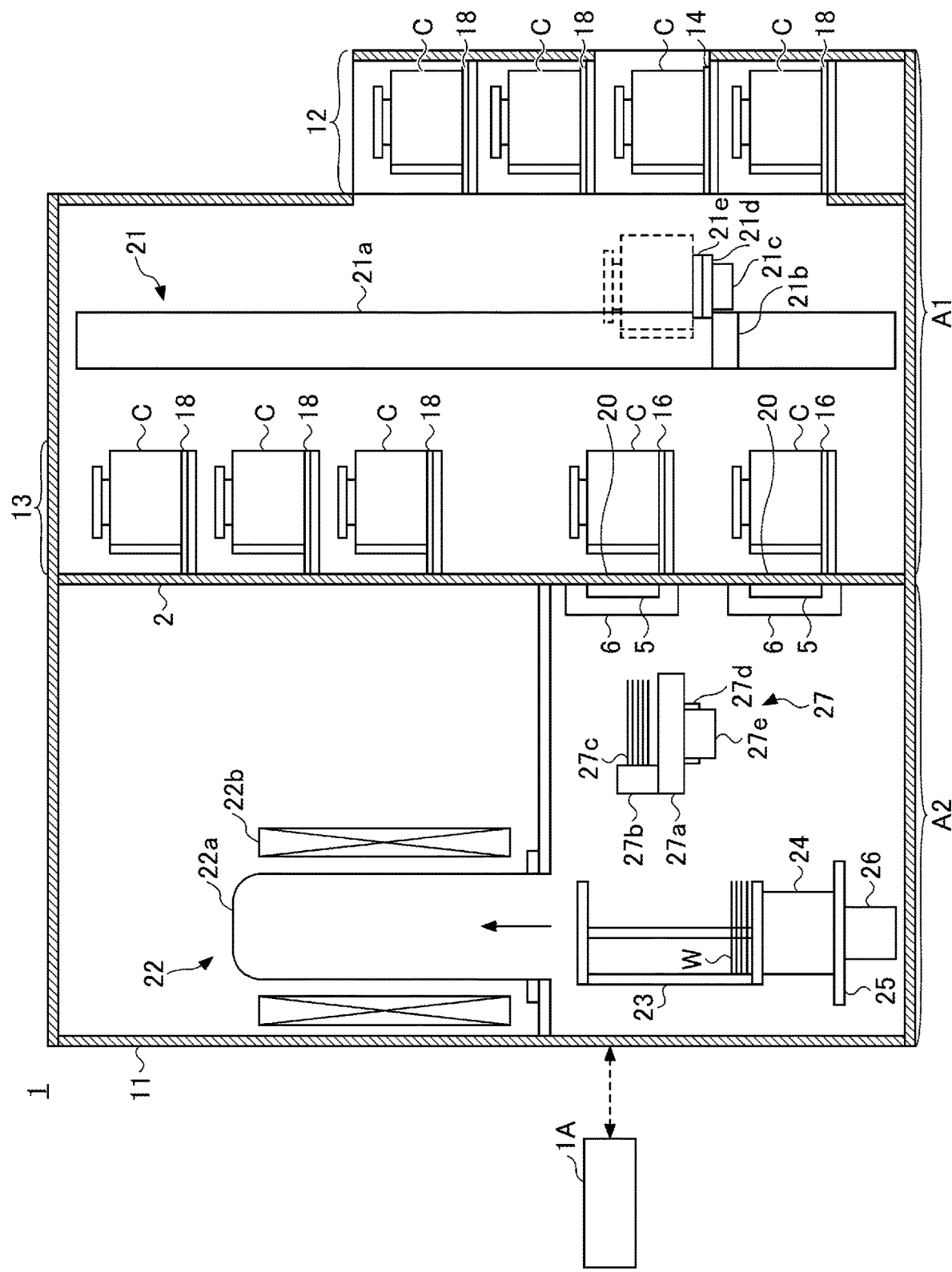
FIG. 1 is a schematic cross-sectional view illustrating an example of a heat treatment apparatus according to an embodiment.

In the following, a non-limiting exemplary embodiment of the present disclosure will be described with reference to the drawings. In every drawing, the same or corresponding members or parts are designated by the same or corresponding reference numerals, and duplicate description is omitted as appropriate.

[Process Reproducibility]

In a batch-type heat treatment apparatus, a heat treatment is performed collectively on a plurality of substrates including a product substrate and a dummy substrate. In such a heat treatment apparatus, the thickness of a film deposited on the product substrate by the heat treatment varies depending on the surface conditions of the dummy substrate, and favorable process reproducibility may not be obtained.

As a result of diligent studies, the inventors of the present invention have found that when a silicon film is formed by a batch-type heat treatment apparatus, the thickness of the silicon film deposited on a product substrate varies depending on the oxidation degree condition of the surface of a dummy substrate. In addition, as a result of diligent studies, the inventors of the present invention have found that when etching is performed using halogen gas after deposition by a batch-type heat treatment apparatus, the halogen gas adsorbed on the surface of the dummy substrate during etching affects the next deposition.

Hereinafter, a heat treatment apparatus and a dummy substrate processing method according to an embodiment by which the process reproducibility of a heat treatment can be improved by adjusting the surface state of a dummy substrate used when the heat treatment is applied to a product substrate in a batch-type heat treatment apparatus will be described.

<Heat Treatment Apparatus>

Figure 2:
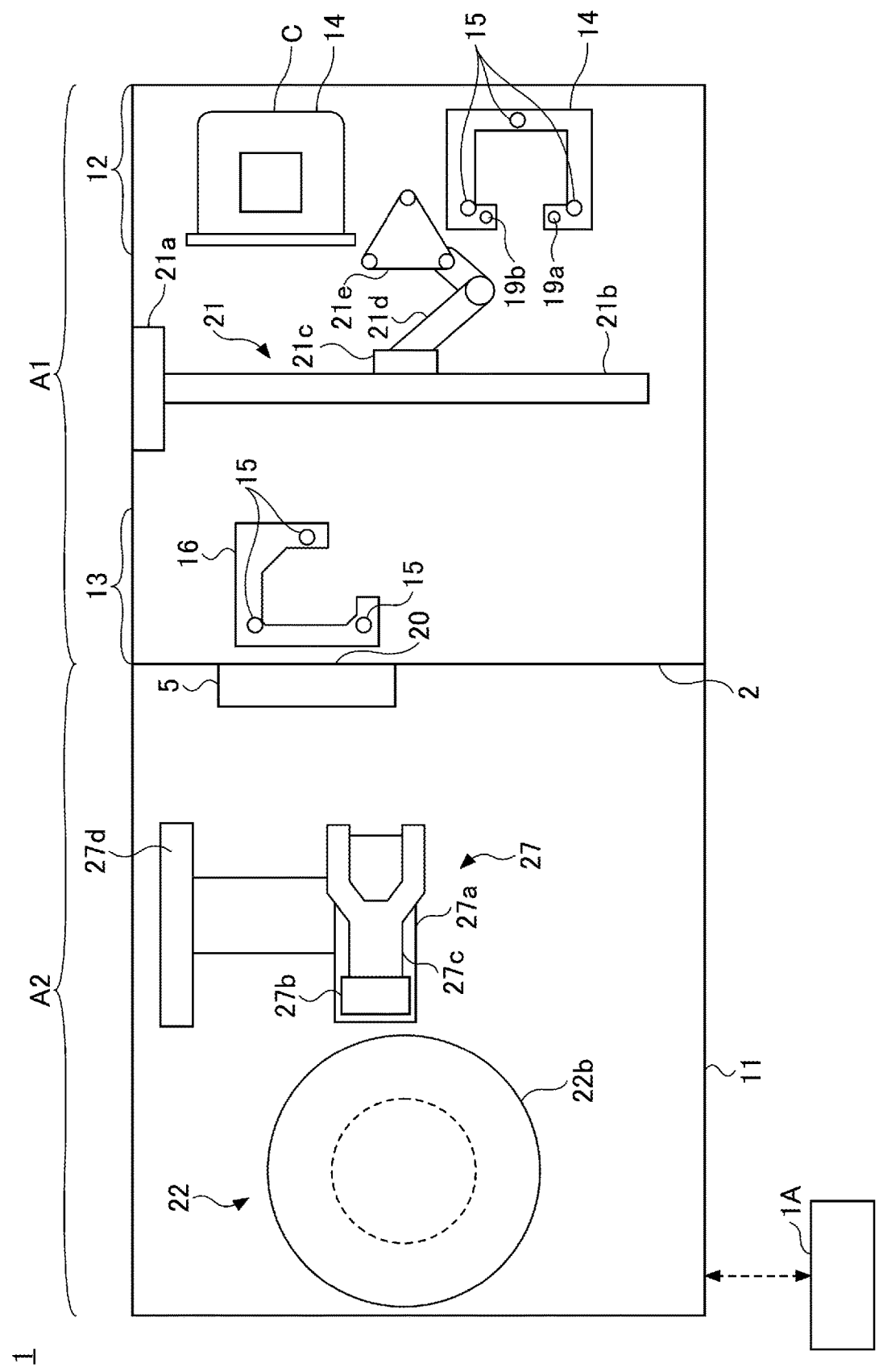
FIG. 2 is a schematic plan view illustrating an example of the heat treatment apparatus according to the embodiment.

Referring to FIG. 1 and FIG. 2, an example of a heat treatment apparatus according to an embodiment will be described.

A heat treatment apparatus 1 is configured to be accommodated in a housing 11. The housing 11 constitutes an outer body of the heat treatment apparatus 1. In the housing 11, a carrier conveyance area A1 where carriers C, which are storage containers that accommodates a plurality of substrates W in multiple stages, are carried into/carried out with respect to the apparatus, and a substrate conveyance area A2 that is a transfer area where the substrates W in the carriers C are conveyed to be carried into a heat treatment furnace 22 (to be described later) are formed. The substrates W may be semiconductor wafers, for example. The carriers C may be, for example, Front-Opening Unified Pods (FOUPs).

The carrier conveyance area A1 and the substrate conveyance area A2 are partitioned by a partition wall 2. The carrier conveyance area A1 is an area under air atmosphere, and is an area where the carrier C is conveyed. An area between each treatment apparatus corresponds to the carrier conveyance area A1. For example, a space in a clean room outside the heat treatment apparatus 1 corresponds to the carrier conveyance area A1. Meanwhile, the substrate conveyance area A2 is set to an inert gas atmosphere, for example, a nitrogen ($N_2$) gas atmosphere to prevent the formation of a natural oxide film on the carried-in substrate W, is cleaner than the carrier conveyance area A1, and is also maintained at a low oxygen concentration. In the following description, the arrangement direction of the carrier conveyance area A1 and the substrate conveyance area A2 is taken as the front-rear direction of the heat treatment apparatus 1.

A conveyance port 20 is provided on the partition wall 2 to convey the substrate W between the carrier conveyance area A1 and the substrate conveyance area A2. The conveyance port 20 is opened/closed by an opening/closing door 5. The opening/closing door 5 is provided with a cover opening/closing mechanism 6 that opens/closes a cover of the carrier C. The conveyance port 20, the opening/closing door 5, and the cover opening/closing mechanism 6 are configured according to Front-Opening Interface Mechanical Standard (FIMS).

The carrier conveyance area A1 includes a first conveyance area 12 and a second conveyance area 13, which is positioned behind the first conveyance area 12 (substrate conveyance area A2 side).

As illustrated in FIG. 2, the first conveyance area 12 is provided with two load ports 14 arranged in the left-right direction. Each load port 14 is a carry-in stage that receives the carrier C when the carrier C is carried in the heat treatment apparatus 1. The load port 14 is provided at an opened portion of the wall of the housing 11 and configured to enable access to the heat treatment apparatus 1 from the outside. Specifically, carry-in and placement of the carrier C on the load port 14 and carry-out of the carrier C from the load port 14 to the outside may be performed by a carrier conveyance apparatus (not illustrated) provided outside the heat treatment apparatus 1.

In addition, carrier storage racks 18 are provided above and below the load port 14 arranged in the first conveyance area 12. Each carrier storage rack 18 is a storage stage that temporarily stores the carrier C. The carrier storage rack 18 stores the carrier C accommodating various substrates W. The various substrates W include, for example, a product substrate, a dummy substrate, and a monitor substrate. Although carrier storage racks 18 may also be provided in the second conveyance area 13, carrier storage racks 18 may be provided at positions in the first conveyance area 12 where the load ports 14 are not present, in order to store a large number of carriers C in the heat treatment apparatus 1.

Pins 15 are provided at, for example, three portions on a placement surface of each load port 14 to position the carrier C.

Each load port 14 may be provided with a supply nozzle 19a and an exhaust nozzle 19b. The bottom surface of the carrier C is provided with, for example, an intake port and an exhaust port. Therefore, in the load port 14, when the carrier C is placed, the supply nozzle 19a may be provided at a position where the intake port of the carrier C is fitted into, and the exhaust nozzle 19b may be provided at a position where the exhaust port of the carrier C is fitted into. By providing the supply nozzle 19a and the exhaust nozzle 19b, when the carrier C is placed on the load port 14, the inert gas substitution in the carrier C may be performed by supplying an inert gas such as $N_2$ gas into the carrier C. As a result, at a stage when the carrier C, which is conveyed in a state where no inert gas is supplied, is carried into the load port 14 in the heat treatment apparatus 1, it is possible to immediately start supplying the inert gas again. Therefore, it is possible to consecutively keep the inside of the carrier C in a clean state.

The inert gas substitution of the carrier C on the load port 14 may be performed when the carrier C that accommodates the substrate W for which the treatment has been completed is carried out from the heat treatment apparatus 1, and the inert gas substitution in the carrier C placed on the load port 14 at the time of the carrying-out may also be performed.

In a lower section of the second conveyance area 13, two carrier stages 16 (see FIG. 1) are arranged in the vertical direction. Each carrier stage 16 is configured to be movable in the front-rear direction. Similarly to the load port 14, pins 15 to position the carrier C are also provided at three portions on a placement surface of each carrier stage 16. In the example of FIG. 1, although the two carrier stages 16 are provided to be arranged in the vertical direction, a plurality of carrier stages 16 may be provided to be arranged in the horizontal direction.

As illustrated in FIG. 1, carrier storage racks are provided in the upper section of the second conveyance area 13 to store the carriers C. The carrier storage racks 18 are constituted by two or more stages of racks, and two carriers C may be placed on the left and right of each rack. An example in which the racks are in three stages is illustrated in FIG. 1. Each carrier storage rack 18 may also be referred to as a "buffer" or a "stocker."

Similarly to the load port 14, a supply nozzle and an exhaust nozzle may be provided on the bottom surface of each carrier storage rack 18. Thereby, the inert gas substitution in the carrier C placed on the carrier storage rack 18 may be performed. When the carrier C accommodating a dummy substrate is placed on the carrier storage rack 18, the supply nozzle functions as an oxidation mechanism to oxidize the dummy substrate by supplying oxygen ($O_2$) gas or dry air in the carrier C. It should be noted that details of the configuration and functions of the carrier storage rack 18 including the supply nozzle and the exhaust nozzle will be described later.

As described above, it is desirable to perform the inert gas substitution at the load ports 14 and the carrier storage racks 18. Since the carrier C such as a FOUP is not completely sealed, it is desirable to continuously perform the inert gas substitution, in order to maintain the humidity even after the inert gas substitution in the closed space using the cover opening/closing mechanism 6. Therefore, it is desirable to consecutively substitute the inert gas at the load ports 14 and the carrier storage racks 18 as well.

A carrier conveyance mechanism 21 is provided in the second conveyance area 13. The carrier conveyance mechanism 21 conveys the carrier C between the load ports 14, the carrier stages 16, and the carrier storage racks 18. The carrier conveyance mechanism 21 includes a first guide 21a, a second guide 21b, a moving section 21c, an arm section 21d, and a hand section 21e. The first guide 21a is configured to extend in the vertical direction. The second guide 21b is configured to be connected to the first guide 21a, and to extend in the left-right direction. The moving section 21c is configured to move in the left-right direction while being guided by the second guide 21b. The arm section 21d includes one joint and two arms sections, and is provided on the moving section 21c. The hand section 21e is provided at the tip of the arm section 21d.

The conveyance port 20 is provided on the partition wall 2. The conveyance port 20 communicates the carrier conveyance area A1 and the substrate conveyance area A2. The conveyance port 20 is provided with the opening/closing door 5 that is configured to close the conveyance port 20 from the substrate conveyance area A2 side. A driving mechanism (not illustrated) is connected to the opening/closing door 5, and the opening/closing door 5 is configured to be movable in the front-rear direction and the vertical direction by the driving mechanism, so that the conveyance port 20 is opened/closed.

The vertical heat treatment furnace 22 is provided in the substrate conveyance area A2 and has an opened lower end as a furnace port. The heat treatment furnace 22 is able to accommodate the substrate W, and includes a cylindrical process container 22a made of quartz for performing the heat treatment of the substrate W. A cylindrical heater 22b is arranged around the process container 22a, and the heat treatment of the accommodated substrate W is performed by heating of the heater 22b. Further, various processing gases are supplied into the process container 22a from a gas supply section (not illustrated). The various processing gases include, for example, a deposition gas, an etching gas, a purge gas, and an $O_2$ gas. A boat 23 that holds a plurality of wafers W in multiple stages is placed on a cap 25 through a heat insulator 24 below the heat treatment furnace 22. The cap 25 is supported on a lifting/lowering mechanism 26, and the boat 23 is carried into or out from the heat treatment furnace 22 by the lifting/lowering mechanism 26.

A substrate conveyance mechanism 27 is provided between the boat 23 and the conveyance port 20 of the partition wall 2. The substrate conveyance mechanism 27 includes a guide mechanism 27a, a moving body 27b, a fork 27c, a lifting/lowering mechanism 27d, and a rotating mechanism 27e. The guide mechanism 27a has a rectangular parallelepiped shape. The guide mechanism 27a is configured to be attached to the lifting/lowering mechanism 27d that extends in the vertical direction to be movable in the vertical direction by the lifting/lowering mechanism 27d, and to be rotatable by the rotating mechanism 27e. The moving body 27b is provided to be movable back and forth along the longitudinal direction on the guide mechanism 27a. The fork 27c is a transfer machine attached via the moving body 27b, and a plurality of (e.g., five) forks 27c are provided. Since a plurality of substrates W may be transferred at the same time by having a plurality of forks 27c, it is possible to shorten the time required to convey the substrates W. It should be noted that the number of forks 27c may be one.

The heat treatment apparatus 1 has a controller 1A for controlling the entire heat treatment apparatus 1. The controller 1A is, for example, a computer and includes a CPU (Central Processing Unit), RAM (Random Access Memory), ROM (Read Only Memory), an auxiliary storage device, and the like. The CPU operates based on a program stored in the ROM or the auxiliary storage device and to control the operation of the heat treatment apparatus 1.

[Carrier Storage Rack]

Referring to FIG. 3 and FIGS. 4A to 4D, an example of a carrier storage rack 18 will be described.

Figure 3:
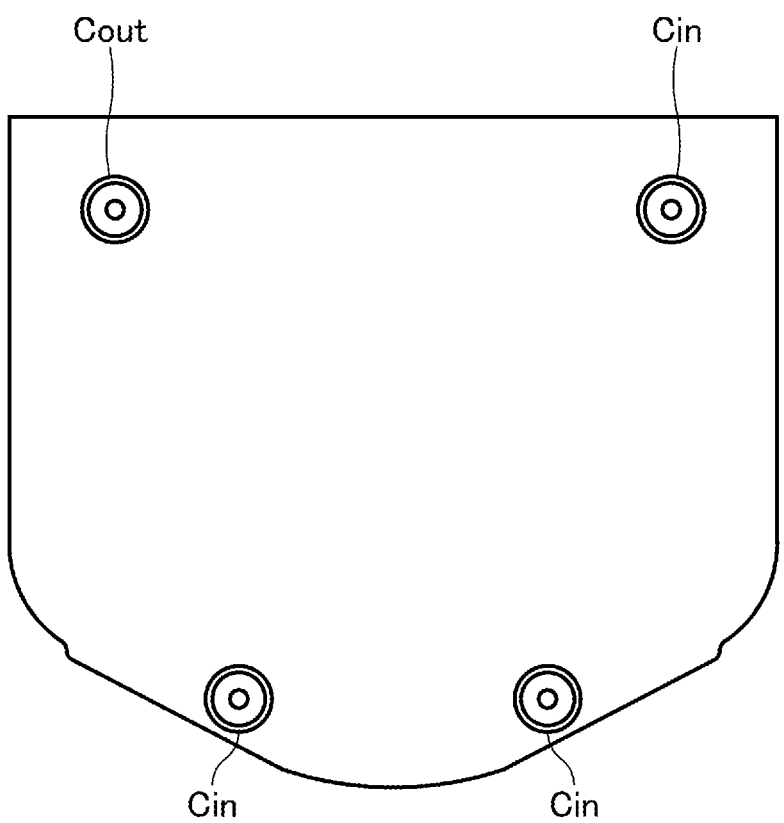
FIG. 3 is a diagram illustrating a bottom surface of an example of a carrier.

FIG. 3 is a diagram illustrating a bottom surface of an example of the carrier C. The carrier C is used in various configurations depending on the usage, but for example, as illustrated in FIG. 3, includes an intake port Cin and an exhaust port Cout. In FIG. 3, three intake ports Cin and one exhaust port Cout are provided.

FIGS. 4A to 4D are diagrams illustrating an example of the carrier storage rack 18. FIG. 4A is a perspective view illustrating the carrier storage rack 18 of the heat treatment apparatus 1. As illustrated in FIG. 4A, a plurality of holes are formed on the surface of the placement surface of the carrier storage rack 18, so that a gas may be supplied to the carrier C. In addition, a plurality of holes may be also formed on the surface of the placement surface of the carrier stage 16, so that a gas may be supplied to the carrier C.

FIG. 4B is an enlarged view of a surface of an example of the carrier storage rack 18. As illustrated in FIG. 4B, a supply nozzle 19c and an exhaust nozzle 19d are formed on the surface of the carrier storage rack 18. The supply nozzle 19c is fitted into the intake port Cin of the carrier C to supply an inert gas, $O_2$ gas, or the like gas into the carrier C through the intake port Cin of the carrier C. The exhaust nozzle 19d is fitted into the exhaust port Cout of the carrier C to exhaust the inside of the carrier C through the exhaust port Cout of the carrier C. Therefore, when the carrier C is placed on the carrier storage rack 18, the supply nozzle 19c and the exhaust nozzle 19d are formed at the positions to be fitted to the intake port Cin and the exhaust port Cout of the carrier C, respectively.

FIG. 4C is a diagram illustrating the supply nozzle 19c of the carrier storage rack 18. The supply nozzle 19c is formed on the surface of the carrier storage rack 18. The supply nozzle 19c is connected to a supply pipe 191 provided on the rear surface of the carrier storage rack 18. $O_2$ gas, an inert gas, or the like is introduced to the supply nozzle 19c via the supply pipe 191.

FIG. 4D is a diagram illustrating the exhaust nozzle 19d of the carrier storage rack 18. The exhaust nozzle 19d is formed on the surface of the carrier storage rack 18. The exhaust nozzle 19d is connected to an exhaust pipe 192 on the rear surface of the carrier storage rack 18. The $O_2$ gas, the inert gas, or the like in the carrier C is exhausted via the exhaust nozzle 19d to the exhaust pipe 192.

By the carrier storage rack 18 having the supply nozzle 19c and the exhaust nozzle 19d, using the intake port Cin and the exhaust port Cout of the carrier C, it is possible to perform the inert gas substitution in the carrier and to oxidize a dummy substrate accommodated in the carrier C.

Similarly to the supply nozzle 19c and the exhaust nozzle 19d of the carrier storage rack 18, the supply nozzle 19a and the exhaust nozzle 19b of the load port 14 illustrated in FIG. 2 may be configured to be connected to the supply pipe 191 and the exhaust pipe 192.

[Oxidation Mechanism]

Figure 5:
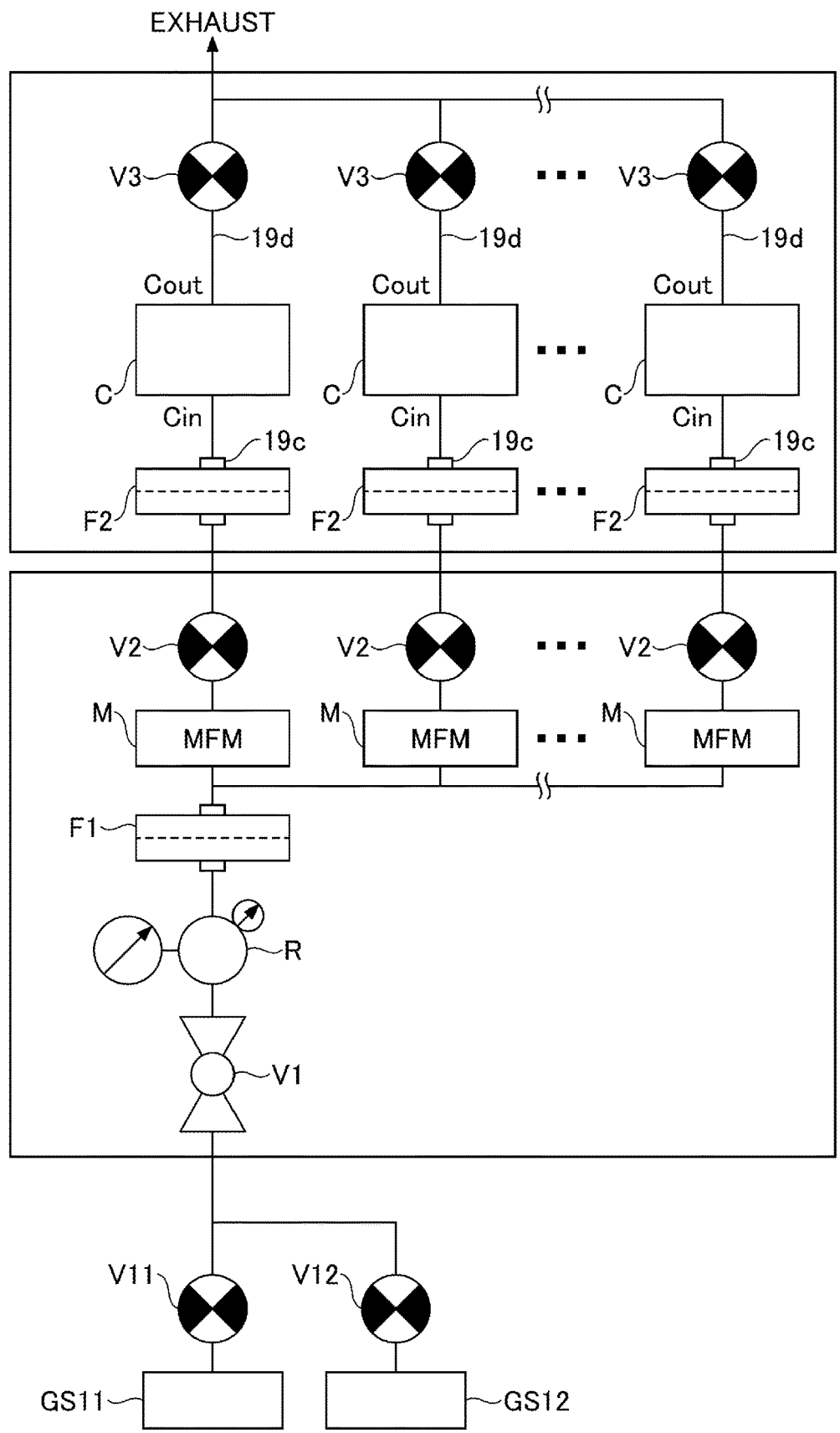
FIG. 5 is a diagram illustrating an example of an oxidation mechanism that introduces an oxidizing gas into carriers.

With reference to FIG. 5, an example of an oxidation mechanism that oxidizes a dummy substrate accommodated in a carrier C placed on the carrier storage rack 18 will be described.

The oxidation mechanism 100 includes gas supply sources GS11 and GS12, opening/closing valves V11 and V12, an opening/closing valve V1, a regulator R, a filter F1, mass flow meters M, opening/closing valves V2, filters F2, supply nozzles 19c, exhaust nozzles 19d, opening/closing valves V3, and the like. The operation of each section of the oxidation mechanism 100 is controlled by the controller 1A.

The gas supply source GS11 is a supply source of an oxidizing gas for oxidizing the dummy substrates. The oxidizing gas may be, for example, $O_2$ gas or dry air. The gas supply source GS12 is a supply source of an inert gas such as noble gas, $N_2$ gas, or the like. The opening/closing valve V11 controls the supply/shutoff of the oxidizing gas from the gas supply source GS11 to the carriers C. The opening/ closing valve V12 controls the supply/shutoff of the inert gas from the gas supply source GS12 to the carriers C.

The opening/closing valves V1 to V3 are valves that open/close gas flow paths. The opening/closing valves V2 and V3 are provided corresponding to the respective carriers C to control the supply/shutoff of the oxidizing gas and the inert gas to the respective carriers C. The regulator R adjusts the supplied high-pressure oxidizing gas and inert gas to a pressure suitable for the application. The filters F1 and F2 are gas filters that remove solids, oils, moisture, and other impurities contained in the oxidizing gas and the inert gas. The mass flow meters M are provided corresponding to the respective carriers C to adjust the flow rates of the oxidizing gas and the inert gas supplied to the respective carriers C.

<Dummy Substrate Processing Method>

Figure 6:
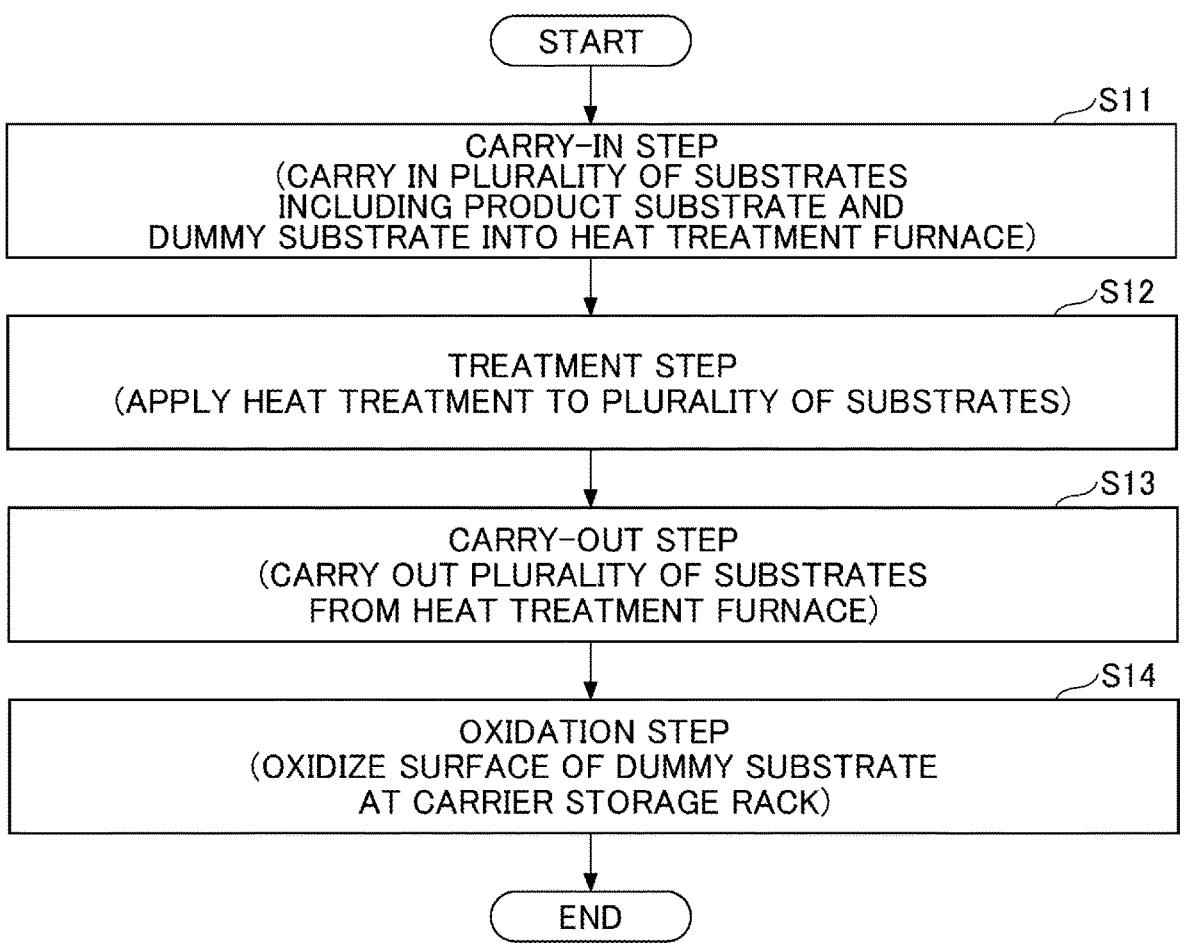
FIG. 6 is a diagram illustrating an example of a dummy substrate processing method of the embodiment.

Referring to FIG. 6, an example of a dummy substrate processing method of the embodiment will be described. The dummy substrate processing method illustrated in FIG. 6 is a method in which when a dummy substrate used in a heat treatment is accommodated and stored in a carrier C, the carrier C is mounted on the carrier storage rack 18, and an oxidizing gas is supplied to the carrier C by an oxidation mechanism to oxidize the surface of the dummy substrate.

First, the controller 1A controls each section of the heat treatment apparatus 1, mounts a plurality of substrates including a product substrate and a dummy substrate on the boat 23, and carries the boat 23 into the heat treatment furnace 22 (carry-in step S11). Dummy substrates are mounted, for example, in slots at both ends, which are empty slots in which product substrates are not mounted, of the slots for mounting substrates in the boat 23.

Subsequently, the controller 1A controls each section of the heat treatment apparatus 1 and applies a heat treatment to the plurality of substrates (treatment step S12). The heat treatment includes, for example, a deposition process of a silicon film and an etching process with a halogen gas after deposition.

Subsequently, the controller 1A controls each section of the heat treatment apparatus 1 and carries out the boat 23 from the inside of the heat treatment furnace (carry-out step S13). In the carry-out step S13, the controller 1A transports and accommodates the product substrate and the dummy substrate from the boat 23, carried out from the heat treatment furnace 22, to different carriers C. The controller 1A transports the carrier C accommodating the dummy substrate to the carrier storage rack 18.

Subsequently, the controller 1A controls each section of the heat treatment apparatus 1 to cause the oxidation mechanism to supply an oxidizing gas in the carrier C mounted on the carrier storage rack 18 to oxidize the surface of the dummy substrate (oxidation step S14). For example, the controller 1A opens the opening/closing valves V11 and V1 to V3 to supply the oxidizing gas, such as $O_2$ gas or dry air, from the gas supply source GS11 into the carrier C. This oxidizes the surface of the dummy substrate. The oxidized dummy substrate is repeatedly used by being placed on the boat 23 together with a product substrate at the time of the next heat treatment.

According to the method of processing the dummy substrate according to the embodiment described above, the dummy substrate to which the heat treatment has been applied together with the product substrate is transported to the carrier storage rack 18 in a state of being accommodated in the carrier C, and the surface is oxidized in the carrier storage rack 18. As a result, even when the dummy substrate is used repeatedly, since the surface state of the dummy substrate is maintained at the same state (in the oxidized state) each time when the heat treatment is applied to the product substrates, favorable process reproducibility is obtained.

Figure 7:
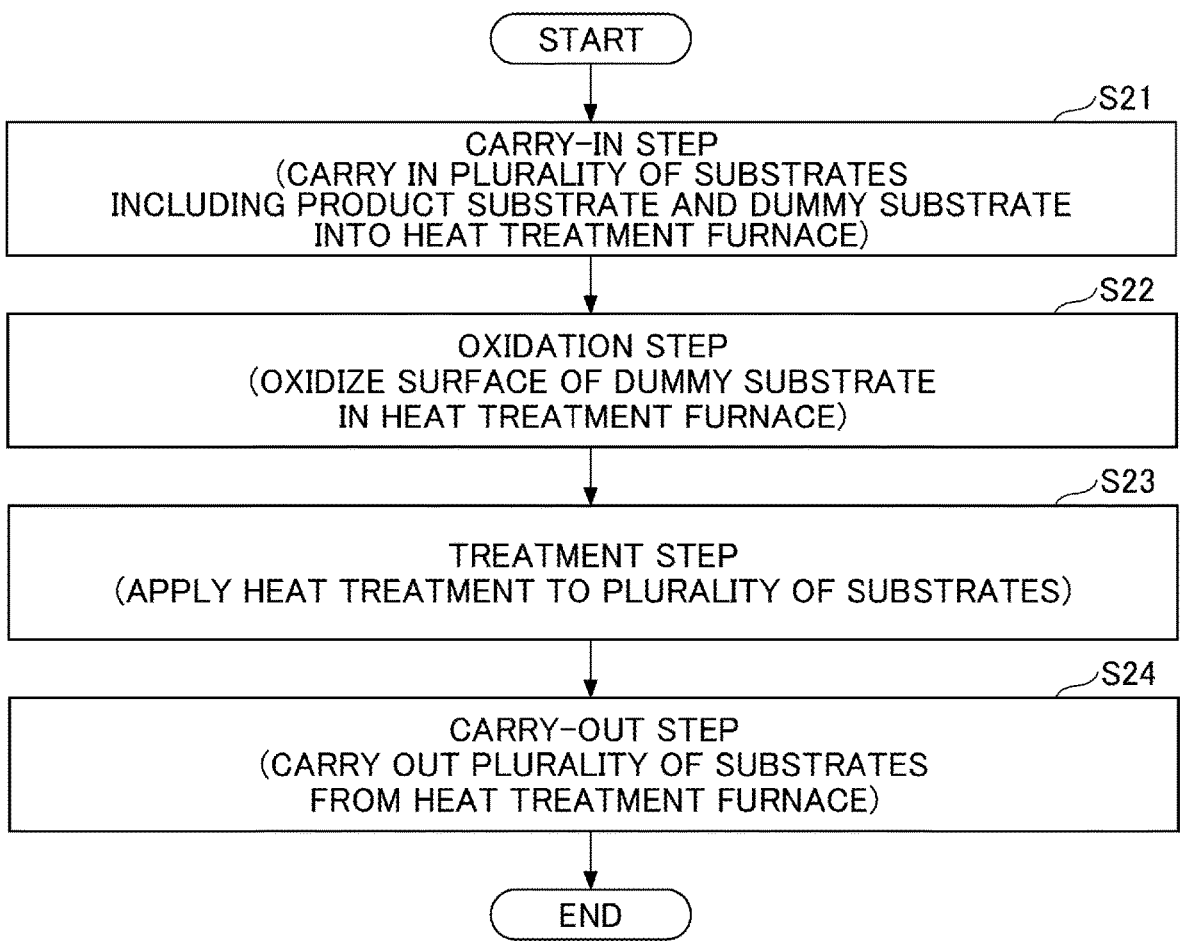
FIG. 7 is a diagram illustrating another example of a dummy substrate processing method of the embodiment.

Referring to FIG. 7, another example of a dummy substrate processing method of the embodiment will be described. The dummy substrate processing method illustrated in FIG. 7 is a method in which, after a plurality of substrates including a product substrate and a dummy substrate are carried into the heat treatment furnace 22 and before a heat treatment is applied to the plurality of substrates, the surface of the dummy substrate is oxidized by supplying $O_2$ gas in the heat treatment furnace 22. In the example of FIG. 7, since the surface of the product substrate may be oxidized with the surface of the dummy substrate, the dummy substrate processing method illustrated in FIG. 7 is preferable in a case of a product substrate having a surface that is not oxidized even when being exposed to an oxidizing gas at the surface, which is, for example, a product substrate on which an oxide film or a nitride film is formed on the surface.

First, the controller 1A controls each section of the heat treatment apparatus 1, mounts a plurality of substrates including a product substrate and a dummy substrate on the boat 23, and carries the boat 23 into the heat treatment furnace 22 (carry-in step S21). Dummy substrates are mounted, for example, in slots at both ends, which are empty slots in which product substrates are not mounted, of the slots for mounting substrates in the boat 23.

Subsequently, the controller 1A controls each section of the heat treatment apparatus 1 to supply $O_2$ gas in the heat treatment furnace 22 to oxidize the surface of the dummy substrate (oxidation step S22).

Subsequently, the controller 1A controls each section of the heat treatment apparatus 1 and applies a heat treatment to the plurality of substrates (treatment step S23). The heat treatment includes, for example, a deposition process of a silicon film and an etching process with a halogen gas after deposition.

Subsequently, the controller 1A controls each section of the heat treatment apparatus 1 and carries out the boat 23 from the inside of the heat treatment furnace (carry-out step S24). In the carry-out step S24, the controller 1A transports and accommodates the product substrate and the dummy substrate from the boat 23, carried out from the heat treatment furnace 22, to different carriers C. The controller 1A transports the carrier C accommodating the dummy substrate to the carrier storage rack 18.

According to the dummy substrate processing method described above, after a plurality of substrates including a product substrate and a dummy substrate are carried into the heat treatment furnace 22 and before a heat treatment is applied to the plurality of substrates, the surface of the dummy substrate is oxidized by supplying $O_2$ gas in the heat treatment furnace 22. As a result, even when the dummy substrate is used repeatedly, since the surface state of the dummy substrate is maintained at the same state (in the oxidized state) each time when the heat treatment is applied to the product substrates, favorable process reproducibility is obtained.

Figure 8:
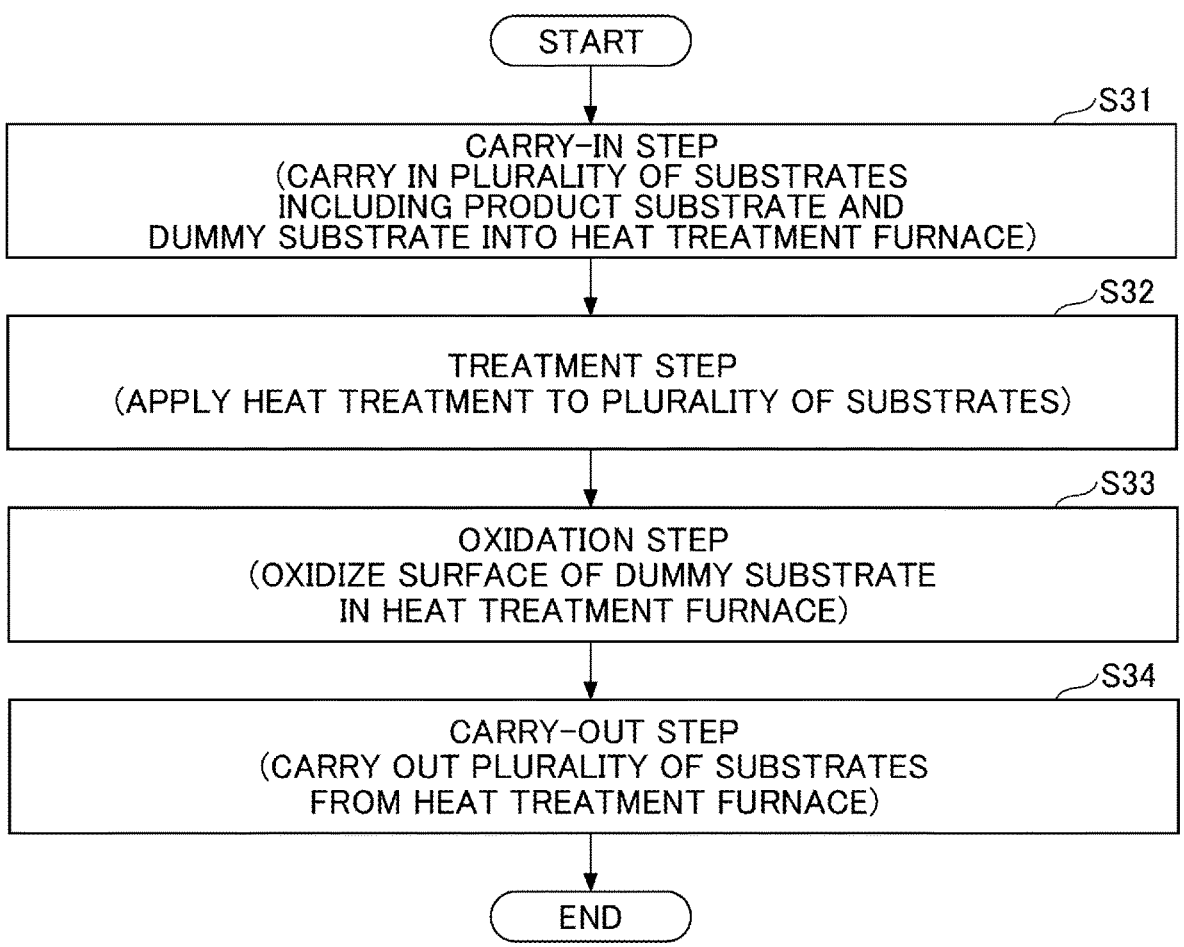
FIG. 8 is a diagram illustrating yet another example of a dummy substrate processing method of the embodiment.

Referring to FIG. 8, yet another example of a dummy substrate processing method of the embodiment will be described. The dummy substrate processing method illustrated in FIG. 8 is a method in which, after a heat treatment is applied to a plurality of substrates including a product substrate and a dummy substrate in the heat treatment furnace 22 and in a state in which the plurality of substrates are accommodated in the heat treatment furnace 22, the surface of the dummy substrate is oxidized by supplying $O_2$ gas in the heat treatment furnace 22. In the example of FIG. 8, since a film deposited on the surface of the product substrate may be oxidized with the surface of the dummy substrate by a heat treatment, the dummy substrate processing method illustrated in FIG. 8 is preferable in a case in which a film deposited by a heat treatment is not oxidized even when being exposed to an oxidizing gas, which is, for example, an oxide film or a nitride film.

First, the controller 1A controls each section of the heat treatment apparatus 1, mounts a plurality of substrates including a product substrate and a dummy substrate on the boat 23, and carries the boat 23 into the heat treatment furnace 22 (carry-in step S31). Dummy substrates are mounted, for example, in slots at both ends, which are empty slots in which product substrates are not mounted, of the slots for mounting substrates in the boat 23.

Subsequently, the controller 1A controls each section of the heat treatment apparatus 1 and applies a heat treatment to the plurality of substrates (treatment step S32). The heat treatment includes, for example, a deposition process of a silicon film and an etching process with a halogen gas after deposition.

Subsequently, the controller 1A controls each section of the heat treatment apparatus 1 to supply $O_2$ gas in the heat treatment furnace 22 to oxidize the surface of the dummy substrate (oxidation step S33).

Subsequently, the controller 1A controls each section of the heat treatment apparatus 1 and carries out the boat 23 from the inside of the heat treatment furnace (carry-out step S34). In the carry-out step S34, the controller 1A transports and accommodates the product substrate and the dummy substrate from the boat 23, carried out from the heat treatment furnace 22, to different carriers C. The controller 1A transports the carrier C accommodating the dummy substrate to the carrier storage rack 18.

According to the dummy substrate processing method described above, after a heat treatment is applied to a plurality of substrates including a product substrate and a dummy substrate in the heat treatment furnace 22, the surface of the dummy substrate is oxidized by supplying $O_2$ gas in the heat treatment furnace 22. As a result, even when the dummy substrate is used repeatedly, since the surface state of the dummy substrate is maintained at the same state (in the oxidized state) each time when the heat treatment is applied to the product substrates, favorable process reproducibility is obtained.

Although the dummy substrate processing methods of the embodiment have been described above with reference to FIG. 6 to FIG. 8, the dummy substrate processing methods illustrated in FIG. 6 to FIG. 8 may be performed alone or may be performed by combining two or more methods.

EXAMPLES

Figures 9A, 9B:
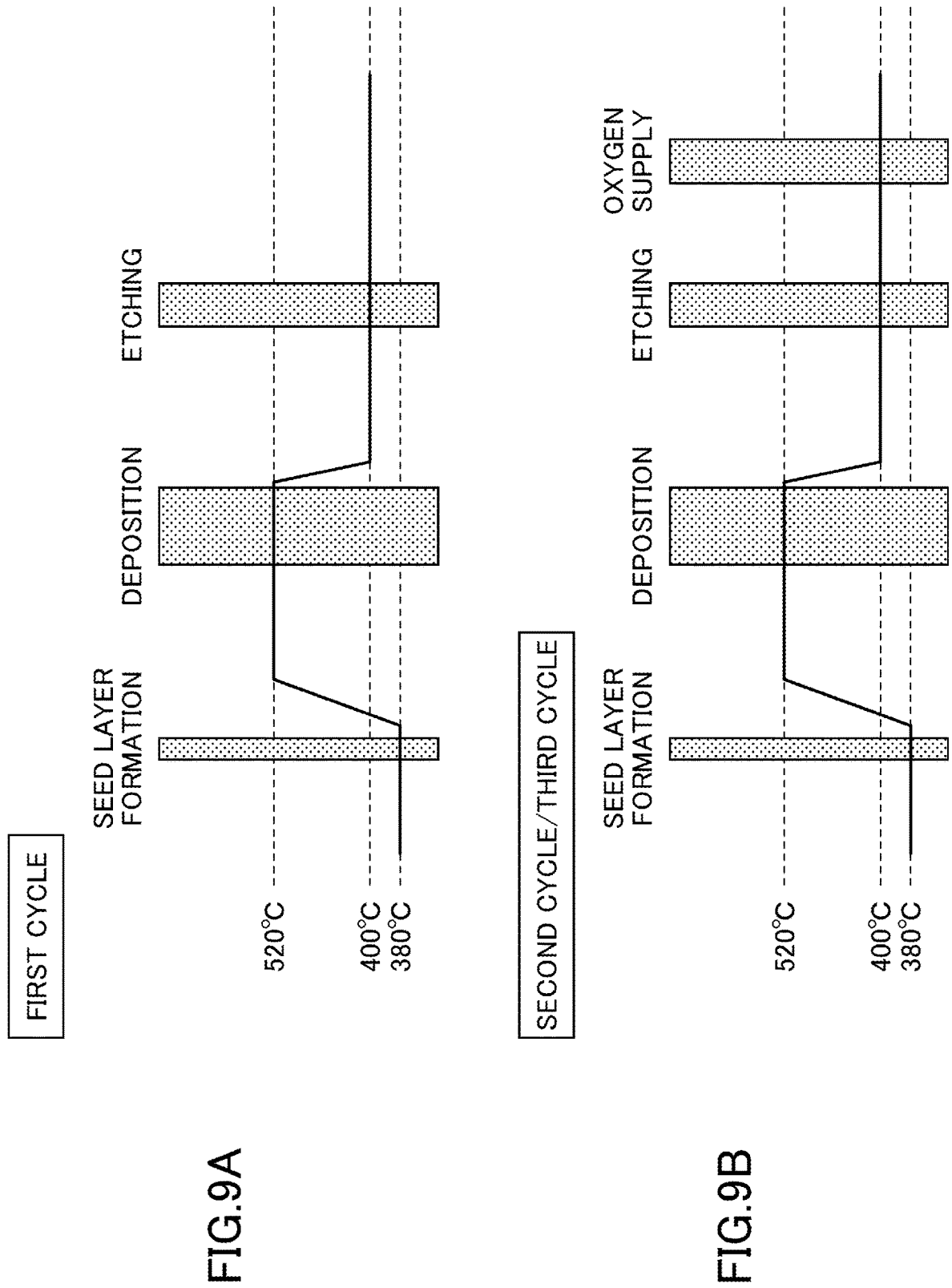
FIGS. 9A and 9B are diagrams for explaining a process flow of Example.

Example 1 implemented by using the heat treatment apparatus 1 of the embodiment will be described with reference to FIGS. 9A and 9B and FIG. 10.

In Example 1, first, the boat 23 holding a plurality of wafers including a dummy wafer and a blanket wafer on which an oxide film was formed was carried into the heat treatment furnace 22 (carry-in step).

After the carry-in step, a first treatment was applied to the plurality of wafers in the heat treatment furnace 22 (first treatment step). The first treatment step is a step of performing a seed layer formation step, a deposition step, and an etching step in this order, as illustrated in FIG. 9A. In the seed layer formation step, by supplying an aminosilane-based gas to the plurality of wafers in a state in which the temperature in the heat treatment furnace 22 was maintained at 380° C., seed layers were formed on the surfaces of the plurality of wafers. In the deposition step, by supplying a monosilane ($SiH_4$) gas to the plurality of wafers in a state in which the temperature in the heat treatment furnace 22 was maintained at 520° C., amorphous silicon (a-Si) films were deposited on the surfaces of the plurality of wafers. The film thickness of the a-Si films is 150 Å. In the etching step, by supplying a chlorine ($Cl_2$) gas to the plurality of wafers in a state in which the temperature in the heat treatment furnace 22 was maintained at 400° C., portions of the a-Si films were etched. The etching film thickness of the a-Si films is 100 Å.

After the first treatment step, the boat 23 was carried out from the heat treatment furnace 22 (carry-out step).

After the carry-out step, without replacing the dummy wafer held by the boat 23, the treated blanket wafer was replaced with an unused blanket wafer (replacement step).

Subsequently, the carry-in step, the first treatment step, the carry-out step, and the replacement step described above were repeated twice in this order. That is, the first cycle of performing the carry-in step, the first treatment step, the carry-out step, and the replacement step in this order was performed three times in total.

Subsequently, the boat 23 holding the plurality of wafers was carried into the heat treatment furnace 22 (carry-in step).

After the carry-in step, a second treatment was applied to the plurality of wafers in the heat treatment furnace 22 (second treatment step). The second treatment step is a step of performing a seed layer formation step, a deposition step, an etching step, and an oxygen supply step in this order, as illustrated in FIG. 9B. The seed layer formation step, the deposition step, and the etching step are the same as the first treatment step. The oxygen supply step is a step of supplying $O_2$ gas to a plurality of wafers while maintaining the temperature in the heat treatment furnace 22 at 400° C. The time (oxygen supply time) of supplying the $O_2$ gas in the oxygenation step is five minutes.

After the second treatment step, the boat 23 was carried out from the heat treatment furnace 22 (carry-out step).

After the carry-out step, without replacing the dummy wafer held by the boat 23, the processed blanket wafer was replaced with an unused blanket wafer (replacement step).

Subsequently, the carry-in step, the second treatment step, the carry-out step, and the replacement step described above were repeated twice in this order. That is, the second cycle of performing the carry-in step, the second treatment step, the carry-out step, and the replacement step in this order was performed three times in total.

Also, the film thickness of the a-Si film deposited on the blanket wafer in each of the first time to third times of the first cycle and the first to third time of the second cycle was measured. FIG. 10 illustrates the measurement result of the film thickness of the a-Si film deposited on each blanket wafer.

In FIG. 10, the measurement results of the film thickness of the a-Si film deposited on the blanket wafer in the first time to third times of the first cycle are illustrated by A1 to A3, respectively. In FIG. 10, the measurement results of the film thickness of the a-Si film deposited on the blanket wafer in the first time to third times of the second cycle are illustrated by B1 to B3, respectively. In the measurement result of the film thickness of the a-Si film deposited on the blanket wafer in each cycle, the effect of whether or not the oxygen supply step was performed after the etching step in the previous cycle is reflected. Therefore, in Example 1, in order to investigate the effect of the presence or absence of the oxygenation supply step on the film thickness of the a-Si film, the results A2 and A3 of the second and third times in the first cycle and the results B2 and B3 of the second and third times in the second cycle were compared.

As illustrated in FIG. 10, the film thickness of the a-Si film when the a-Si film was deposited without performing the oxygen supply step after the etching step was 50.2 Å and 49.3 Å, respectively, and the difference in the film thickness between the two was 0.9 Å (A2, A3). On the other hand, the film thickness of the a-Si film when the a-Si film was deposited after performing the oxygen supply step after the etching step was 59.1 Å and 59.0 Å, respectively, and the difference in the film thickness between the two was 0.1 Å (B2, B3). The results indicate that the process reproducibility is improved by depositing the a-Si film after performing the oxygen supply step after the etching step.

Example 2 implemented by using the heat treatment apparatus 1 of the embodiment will be described with reference to FIGS. 9A and 9B, FIG. 11, and FIG. 12.

In Example 2, first, the second cycle of performing the carry-in step, the second treatment step, the carry-out step, and the replacement step in this order was performed four times.

Subsequently, the third cycle of performing the carry-in step, a third treatment step, the carry-out step, and the replacement step in this order was performed four times. The third treatment step is a step in which the oxygen supply time in the oxygen supply step of the second treatment step is changed from five minutes to fifteen minutes (see FIG. 9B).

Figure 11:
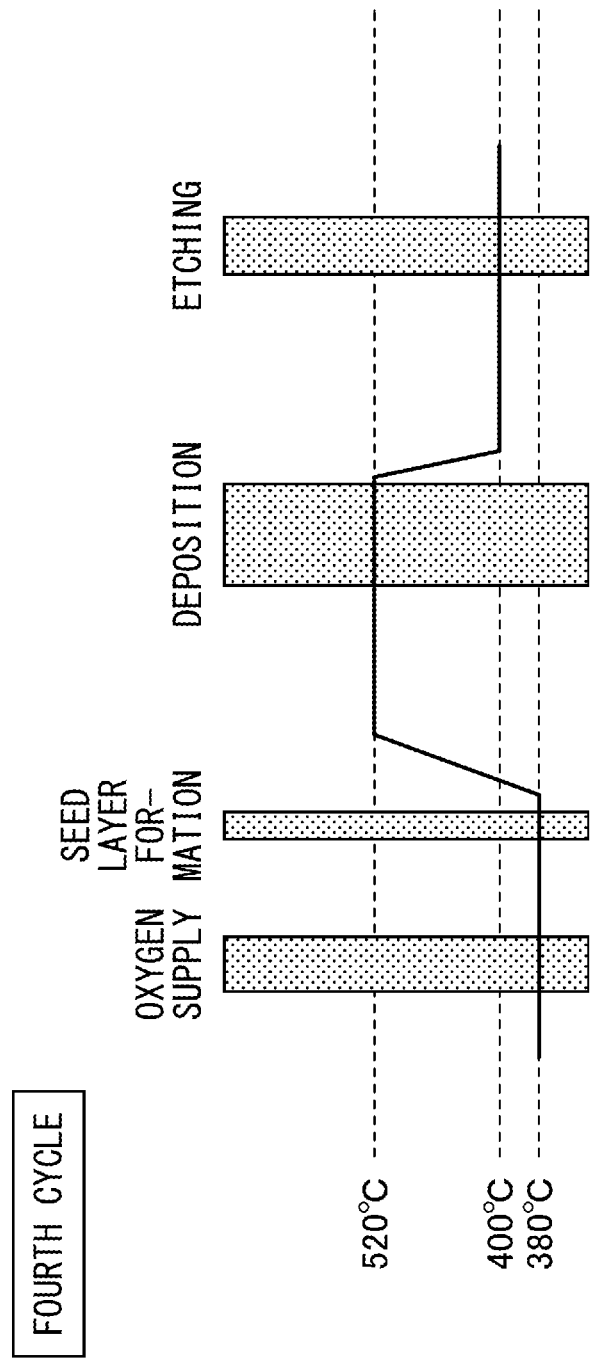
FIG. 11 is a diagram for explaining a process flow of Example.

Subsequently, the fourth cycle of performing the carry-in step, a fourth treatment step, the carry-out step, and the replacement step in this order was performed three times in total. The fourth treatment step is a step of performing an oxygen supply step, a seed layer formation step, a deposition step, and an etching step in this order, as illustrated in FIG. 11. The oxygen supply time in the oxygenation step is fifteen minutes.

Figure 12:
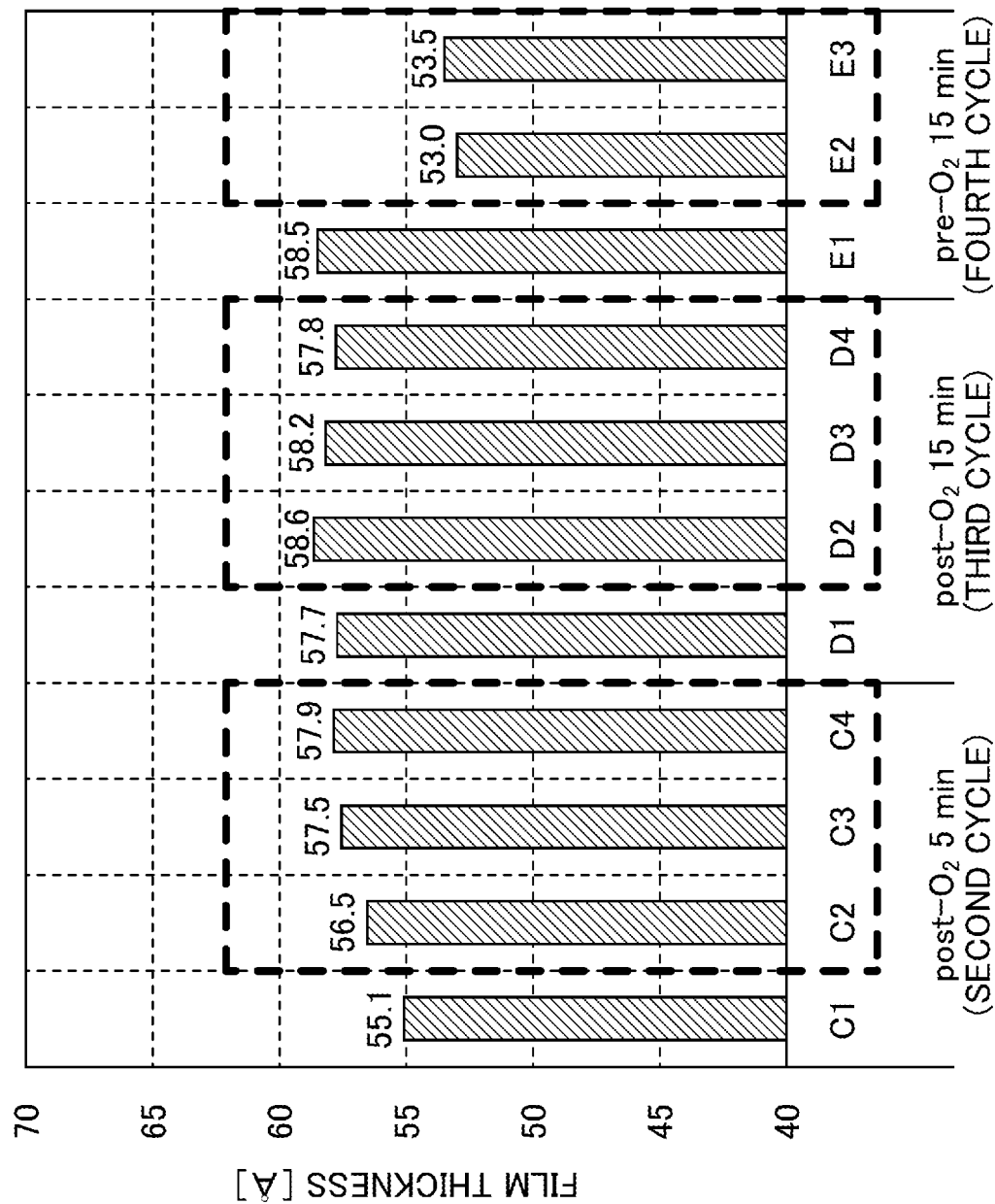
FIG. 12 is a diagram illustrating evaluation results of Example 2.

Also, the film thickness of the a-Si film deposited on the blanket wafer in each of the first to fourth times of the second cycle, the first to fourth times of the third cycle, and the first to third times of the fourth cycle was measured. FIG. 12 illustrates the measurement result of the film thickness of the a-Si film deposited on each blanket wafer.

In FIG. 12, the measurement results of the film thickness of the a-Si film deposited on the blanket wafer in the first to fourth times of the second cycle are illustrated by C1 to C4, respectively. In FIG. 12, the measurement results of the film thickness of the a-Si film deposited on the blanket wafer in the first to fourth times of the third cycle are illustrated by D1 to D4, respectively. In FIG. 12, the measurement results of the film thickness of the a-Si film deposited on the blanket wafer in the first to fourth times of the second cycle are illustrated by E1 to E3, respectively. In the measurement result of the film thickness of the a-Si film deposited on the blanket wafer in each cycle, the effect of whether or not the oxygen supply step was performed after the etching step in the previous cycle is reflected. Therefore, in Example 2, in order to investigate the effect of the presence or absence of the oxygenation supply step on the film thickness of the a-Si film, the results C2 to C4 of the second to fourth times of the second cycle, the results D2 to D4 of the second to fourth times of the third cycle, and the results E2 and E3 of the second and third times of the fourth cycle were compared.

As illustrated in FIG. 12, the film thickness of the a-Si film when the a-Si film was deposited after performing the oxygen supply step (oxygen supply time of fifteen minutes) after the etching step was 56.5 Å, 57.5 Å, and 57.9 Å, respectively, and the range of film thickness distribution was 1.4 Å (C2 to C4). Also, the film thickness of the a-Si film when the a-Si film was deposited after performing the oxygen supply step (oxygen supply time of fifteen minutes) after the etching step was 58.6 Å, 58.2 Å, and 57.8 Å, respectively, and the range of film thickness distribution was 0.8 Å (D2 to D4). The results indicate that the process reproducibility is further improved by increasing the oxygen supply time in the oxygen supply step.

In addition, as illustrated in FIG. 12, the film thickness of the a-Si film when the oxygen supply step (oxygen supply time of fifteen minutes) was performed before the depositing the a-Si film was 53.0 Å and 53.5 Å, respectively, and the range of film thickness distribution was 0.5 Å (E2 to E3). The results indicate that the process reproducibility is particularly improved by also supplying $O_2$ gas into the heat treatment furnace 22 after carrying the plurality of wafers into the heat treatment furnace 22 and before depositing the a-Si film on the plurality of wafers.

The embodiments disclosed herein should be considered to be exemplary in all respects and not restrictive. The above embodiments may be omitted, substituted, or modified in various forms without departing from the appended claims and spirit thereof.

In the embodiments described above, the deposition apparatus is a semi-batch type apparatus that revolves a plurality of wafers arranged on a rotation table in a vacuum container by the rotation table, that causes the wafers to pass through a plurality of areas in order and, that processes the wafers, but the present disclosure is not limited to this. For example, a processing apparatus may be a single-wafer type apparatus that processes wafers one by one.

What is claimed is:

1. A heat treatment apparatus for applying a heat treatment to a plurality of substrates including a product substrate and a dummy substrate, the heat treatment apparatus comprising:
   a process container configured to accommodate the plurality of substrates, the dummy substrate of the accommodated substrates having a surface;
   storage containers;
   at least one storage rack on which a first storage container among the storage containers is to be placed, the storage rack being provided outside the process container;
   an oxidation mechanism configured to oxidize the surface of the dummy substrate stored in the first storage container;
   a substrate container;
   a substrate transfer device configured to move between the substrate container and the storage containers; and
   a controller including a processor, and a memory having programming stored therein that causes the processor to:
   heat-treat the plurality of substrates and the dummy substrate within the process container, transfer the substrate container that holds the heat-treated substrates, out of the process container, move the substrate transfer device such that the product substrate and the dummy substrate among the heat-treated substrates are transferred from the substrate container into the respective storage containers, transfer the first storage container that holds the heat-treated dummy substrate, among the storage containers, to the storage rack, and control the oxidation mechanism to supply an oxidizing gas to the first storage container on the storage rack to oxidize the surface of the dummy substrate outside the process container;

wherein the oxidation mechanism improves a process reproducibility of the heat treatment by having a same amorphous silicon film thickness on the surfaces of the plurality of substrates.

2. The heat treatment apparatus according to claim 1, wherein the oxidation mechanism includes a supply section configured to supply the oxidizing gas to the first storage container.

3. The heat treatment apparatus according to claim 2, wherein the oxidizing gas includes $O_2$ gas or dry air.

4. The heat treatment apparatus according to claim 1, wherein the first storage container is configured to hold the dummy substrate in each of multiple stages.

5. The heat treatment apparatus according to claim 1, wherein the dummy substrate is configured to be heat-treated repeatedly.

6. The heat treatment apparatus according to claim 1, further comprising:

a gas supply section configured to supply a process gas to the process container, the process gas including first gas used in deposition, an etching gas, and $O_2$ gas, wherein the programming causes the processor to transfer the substrate container holding the plurality of substrates to the process container, before the heat-treating of the plurality of substrates, wherein the heat-treating of the plurality of substrates includes (i) supplying the first gas from the gas supply section to the plurality of substrates in the process container to deposit the amorphous silicon films on the surfaces of the respective substrates, (ii) supplying the etching gas from the gas supply section to the amorphous silicon films to etch a portion of the amorphous silicon film on the surface of each of the substrates, and (iii) supplying the $O_2$ gas from the gas supply section to the substrates to oxidize the surface of at least the dummy substrate of the substrates, and wherein (i), (ii), and (iii) are performed in this order.

* * * * *